United States Patent
Cummings

(10) Patent No.: US 10,187,811 B2
(45) Date of Patent: *Jan. 22, 2019

(54) ORCHESTRATING WIRELESS NETWORK OPERATIONS

(71) Applicant: Mark Cummings, Atherton, CA (US)

(72) Inventor: Mark Cummings, Atherton, CA (US)

(73) Assignee: Mark Cummings, Atherton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/060,478

(22) Filed: Mar. 3, 2016

(65) Prior Publication Data
US 2016/0255517 A1 Sep. 1, 2016

Related U.S. Application Data

(63) Continuation of application No. 13/290,736, filed on Nov. 7, 2011, now Pat. No. 9,311,108.

(60) Provisional application No. 61/456,385, filed on Nov. 5, 2010.

(51) Int. Cl.
| | |
|---|---|
| *H04W 24/02* | (2009.01) |
| *H04W 8/22* | (2009.01) |
| *H04W 28/02* | (2009.01) |
| *H04W 48/16* | (2009.01) |
| *H04W 24/00* | (2009.01) |
| *G06F 9/4401* | (2018.01) |

(Continued)

(52) U.S. Cl.
CPC ........... *H04W 24/02* (2013.01); *G06F 9/4411* (2013.01); *G06F 17/505* (2013.01); *H04L 67/16* (2013.01); *H04W 8/22* (2013.01); *H04W 28/0215* (2013.01); *H04W 48/16* (2013.01); *H04W 24/00* (2013.01)

(58) Field of Classification Search
CPC combination set(s) only.
See application file for complete search history.

(56) References Cited

U.S. PATENT DOCUMENTS

| | | |
|---|---|---|
| 5,555,286 A | 9/1996 | Tendler |
| 5,751,909 A | 5/1998 | Gower |
| 5,966,531 A | 10/1999 | Skeen |

(Continued)

FOREIGN PATENT DOCUMENTS

| | | |
|---|---|---|
| CN | 101013957 | 8/2007 |

OTHER PUBLICATIONS

Trusted Computing Group, TCG Trusted Network Connect, TNC IF-MAP Binding for SOAP, Specification Version 1.1, Revision 5, May 18, 2009.

*Primary Examiner* — Yee Lam
(74) *Attorney, Agent, or Firm* — Van Pelt, Yi & James LLP

(57) ABSTRACT

A wireless communication system is disclosed. A data store stores for each of a plurality of nodes, each node comprising a wireless communication system element, a node image data comprising metadata about or otherwise associated with the node. In various embodiments, the data store has the capability to create and support an organically changing schema, and provides a mechanism to propagate changes to the schema or data, but only as necessary. A processor receives an indication of an objective and uses node image data stored in the data store to identify programmatically from among the plurality of nodes a node to help achieve the objective and to determine the configuration of the node.

30 Claims, 17 Drawing Sheets

(51) Int. Cl.
*G06F 17/50* (2006.01)
*H04L 29/08* (2006.01)

(56) References Cited

U.S. PATENT DOCUMENTS

| | | | |
|---|---|---|---|
| 5,970,490 A | 10/1999 | Morgenstern | |
| 6,438,594 B1 | 8/2002 | Bowman-Amuah | |
| 6,618,805 B1* | 9/2003 | Kampe | G06F 11/1433 |
| | | | 713/1 |
| 6,711,624 B1 | 3/2004 | Narurkar | |
| 7,263,551 B2 | 8/2007 | Belfiore | |
| 8,775,218 B2 | 7/2014 | Burgoon, Jr. et al. | |
| 9,317,843 B2 | 4/2016 | Bradley | |
| 2003/0074443 A1* | 4/2003 | Melaku | H04L 12/5692 |
| | | | 709/224 |
| 2004/0267965 A1 | 12/2004 | Vasudevan | |
| 2005/0096055 A1 | 5/2005 | Colban | |
| 2005/0203892 A1 | 9/2005 | Wesley et al. | |
| 2006/0007919 A1 | 1/2006 | Steinheider | |
| 2007/0130208 A1 | 6/2007 | Bornhoevd | |
| 2007/0283317 A1 | 12/2007 | Sadler et al. | |
| 2008/0046292 A1 | 2/2008 | Myers et al. | |
| 2009/0080408 A1 | 3/2009 | Natoli et al. | |
| 2009/0100178 A1 | 4/2009 | Gonzales | |
| 2010/0202391 A1 | 8/2010 | Palanki | |
| 2011/0007708 A1 | 1/2011 | Hapsari | |
| 2011/0116480 A1 | 5/2011 | Li | |
| 2011/0138060 A1* | 6/2011 | Purkayastha | H04L 65/605 |
| | | | 709/227 |
| 2011/0153854 A1* | 6/2011 | Chickering | H04L 63/0815 |
| | | | 709/229 |
| 2011/0182253 A1 | 7/2011 | Shekalim | |
| 2011/0250911 A1 | 10/2011 | Xu | |
| 2012/0033621 A1 | 2/2012 | Mueck | |
| 2012/0096525 A1 | 4/2012 | Bolgert et al. | |
| 2013/0237182 A1 | 9/2013 | Schlager | |
| 2016/0259902 A1 | 9/2016 | Feldman | |
| 2017/0103215 A1 | 4/2017 | Mahaffey | |

* cited by examiner

ORCHESTRATING WIRELESS NETWORK OPERATIONS

CROSS REFERENCE TO OTHER APPLICATIONS

This application is a continuation of co-pending U.S. application Ser. No. 13/290,736, entitled ORCHESTRATING WIRELESS NETWORK OPERATIONS, filed Nov. 7, 2011, which, claims priority to U.S. Provisional Patent Application No. 61/456,385, entitled COLLABORATIVE COMMUNICATIONS AND COMPUTING, filed Nov. 5, 2010, both of which are incorporated herein by reference for all purposes.

BACKGROUND OF THE INVENTION

Operators of Networks (typically combinations of WAN's, LAN's, PAN's and BAN's supporting two way interactive services and in some countries are called cellular network operators) of wireless devices today face a difficult problem. The problem is the result of the convergence of complexity and scale. The current technology for network orchestration is capable of optimizing very large-scale networks with low levels of complexity or high levels of complexity and small scale. Current networks of wireless devices face both very large numbers of end users creating very large scale and very high levels of complexity in technology, equipment ecosystems, and administrative organization.

Typical Networks today range in size from several tens of millions to multiple hundreds of millions of Nodes (active components including mobile end user and infrastructure devices). They are expected to continue to grow in size to support the 'internet of things'. This growth in size is expected to be dramatic.

Complexity is a result of the history of the evolution of the Networks, the various vested interests involved and the evolution of technology and products. FIG. 1A illustrates some of the complexity facing the Network. It shows the multiple administrative units, each with its own Network Operations Center (NOC) 104 that make up the Network infrastructure. Each NOC has a set of databases of information 106 divided by each vendor of equipment used in that network portion. For each vendor and type of equipment there are separate control consoles 108 manned by separately trained individual staff members. Typically an operator trained on one console for one type and vendor of equipment cannot work on the console of another type and vendor of equipment. A further level of complexity is the ownership of the resources and NOC's. It is possible for all the resources and all the NOC's to be owned by a single corporate entity. In that case, however, different divisions own and operate different resources and NOC's. The different divisions jealously guard their own domains. What is more typical is that different corporations and government entities own different resources and NOC's. This ownership can be more complicated than shown in the illustration. For example, a local government may own fiber optic cable in the ground. It may subcontract the management of the actual fiber to company X. Company Y may lease access to the fiber to provide a basic network service which it sells to the Wireline company in the illustration. In this example, companies X and Y also have NOC's. Another example is that company Z may purchase 'wholesale' services from the Network under an MVNO or enterprise networking contract and then provide services to end users and therefore maintain its own NOC. There are many other typically occurring subdivisions and resulting NOC's.

One thing that is not shown in FIG. 1A, because it would make the diagram so complex as to be unreadable, is the profusion of types and vendors of end user devices. Networks try to limit the diversity of end user devices, but even so, the diversity is extremely great. It is not unusual for a Network to try to limit itself to five vendors of end user devices. However, over time that list changes, pressures from the marketplace force expansions in the approved vendor list and mergers also come into play. Then a single vendor may have as many as 50 product lines with multiple products in each product line. Individual products change to lower cost, meet changing markets and to fix problems or add capabilities through in field software downloads. The result is that Networks have thousands of different products, configurations, etc. Here again, the Network attempts to track and control this diversity with vendor specific databases and consoles.

The third area of complexity is the profusion of technologies. The rapid adoption of cellular, wireless LAN, and other related wireless technologies produced demand for better quality and better spectral efficiency (getting more channels into the same frequency range). These forces have produced a proliferation of Air Interface Standards (AIS's). An AIS specifies modulation, coding, error correction, protocols for channel assignment and other key technical parameters that determine how both the radio access network, backhaul and the rest of the infrastructure operate. Networks typically support a number of AIS's. Network operators seek to limit the number of AIS's but forces outside their control prevent it. The transition from one AIS to another may be through software upgrade in the infrastructure accompanied by distribution of new end user devices. An example of this is the transition from GSM to GSM GPRS. Other transitions require the construction and operation of two independent networks each with its own set of NOC's. The old AIS network has to run until all or almost all of the end user devices have been replaced with new AIS devices. This can take many years and typically before the old AIS is fully supplanted there is a newer AIS which replaces the old 'new' AIS. As an example, there are many Networks today which operate three independent systems for 2G, 3G, and 4G. Each time a new AIS is developed it promises to be the last one which will replace all others, but it is eventually superseded by a 'newer' one.

Modern mobile telecommunication devices are configured to communicate via provider networks in a variety of ways. For example, a device may communicate via a traditional base transceiver station, a femtocell, or via a WiFi or other wireless access point or through Blue tooth or other Personal Area Network (PAN or WPAN) or through a Body Area Network (BAN or WBAN). However, each of these wireless access technologies has its own family of Air Interface Standards (protocols, modulation techniques, encoding systems, etc.) and infrastructure, which have evolved at least partly independently over time and which are to date not well integrated. In many cases, multiple network and other service providers may be involved, for example, a wireless carrier operating a traditional base transceiver station, a local business or municipality operating a WiFi access point, and a femtocell user who uses a cable modem or DSL to backhaul call data over an IP network such as the Internet. The diversity of access technologies and owners poses challenges to the ability of mobile users to seamlessly obtain and maintain access optimally across technologies and providers, and for providers to orchestrate resources across technologies and owners to provide access, monitor operating conditions, meet quality of service and other commitments, etc. Some of these difficulties have been documented by NGMN (Next Generation Mobile Network an international industry association of approximately 150 wireless network operators)

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The Process abstracts all devices in the Network as nodes. Each node has a set of objectives. These objectives can be considered to be similar to a job description and a management by objective set of objectives. Each node also has a set of rules. These rules are either limit functions or if-then statements. Each node has a set of algorithms. The algorithms are a set of tools available to the node to try to achieve its objectives given a set of conditions within the constraints of its rules. Each node monitors its internal configuration and external environment.

Figure 1A:
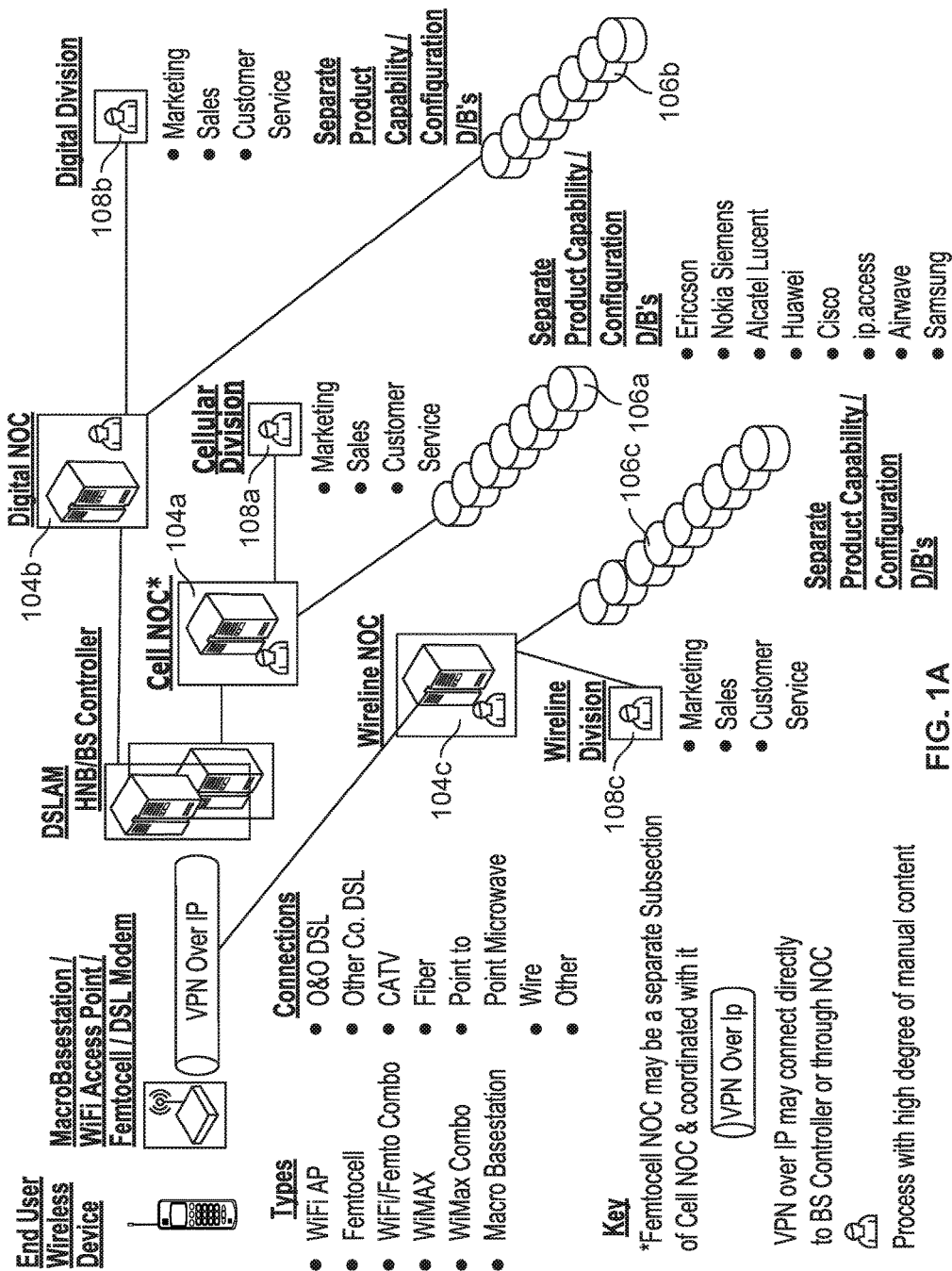
FIG. 1A illustrates some of the complexity facing the Network.
Figure 1B:
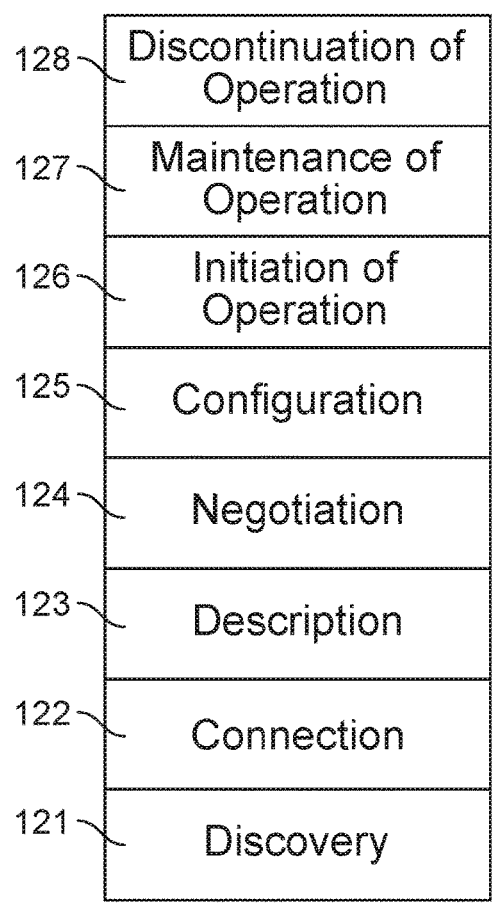
FIG. 1B illustrates a protocol used by nodes in various embodiments to interact with the other nodes in the network.

FIG. 1B illustrates a protocol used by nodes in various embodiments to interact with the other nodes in the network. In some embodiments, the protocol is implemented as and/or can be understood to comprise a state machine. This protocol differs from the ISO OSI (International Standards Organization Open System Interconnect) Model in that all information in each layer is available to all other layers. In the example shown, the eight layer (or state) model of the Process 120 used in various embodiments to coordinate wireless Network elements comprises stages of Discovery 121, Connection 122, Description 123, Negotiation 124, Configuration 125, Initiation 126, Maintenance 127, and Discontinuation 128.

In the Process 120, in various embodiments a node uses the protocol as follows. It seeks to satisfy its objectives by discovering another node(s) which may help it do so. It performs the Discovery process 121 by a combination of sensing relevant communication parameters and sending out messages identifying itself and its objectives. When it Discovers another node which may appear capable of helping, it establishes a Connection 122. The Connection 122 is for the purpose of Description 123, Negotiation 124, Configuration 125, Initiation 126, Maintenance 127, and Discontinuation 128. Once a Connection 122 is established, the two nodes exchange Descriptions 123. In various embodiments, the Description 123 includes one or more of the following expressed in a common metalanguage: one or more objectives of the node; one or more capabilities of the node; one or more rules the node is required to follow; and one or more protocols and/or algorithms the node has available for use. Based on the Description 123 received from the other node, each node determines if the other node can help it achieve its objectives. If so, the two nodes proceed to Negotiation 124. The first node bids a set of parameters that will help it achieve its objective. If the second node determines that a modified version of the parameters will better help it to achieve its objectives, it sends a counter bid. This proceeds to the point where both nodes accept the same bid. This acceptance constitutes a bind or contract. Once a bind has occurred, each node Configures 125 itself in accordance with the bind. Once Configuration 125 is complete, Initiation 126 can commence. Because Initiation 126 may involve very time critical events, the Initiation 126 procedure to be used can be part of the bind and prepared for in the Configuration 125 stage. Once Initiation 126 has taken place, in Maintenance 127 both nodes continue to monitor the environment. If there are changes that make the current Initiation sub optimal, while continuing to operate in the Initiation in place, the two nodes start a new negotiation which may result in a new Configuration and a new Initiation or a Discontinuation 128 of Operation.

The Process is implemented in various embodiments by a software agent that receives its objectives, rules, algorithms, environmental information, etc. from an IF-MAP or other data store that has the capability to create and support an organically growing/evolving/changing schema, and provides a mechanism to propagate changes to the schema or data, but only as necessary.

Figure 10:
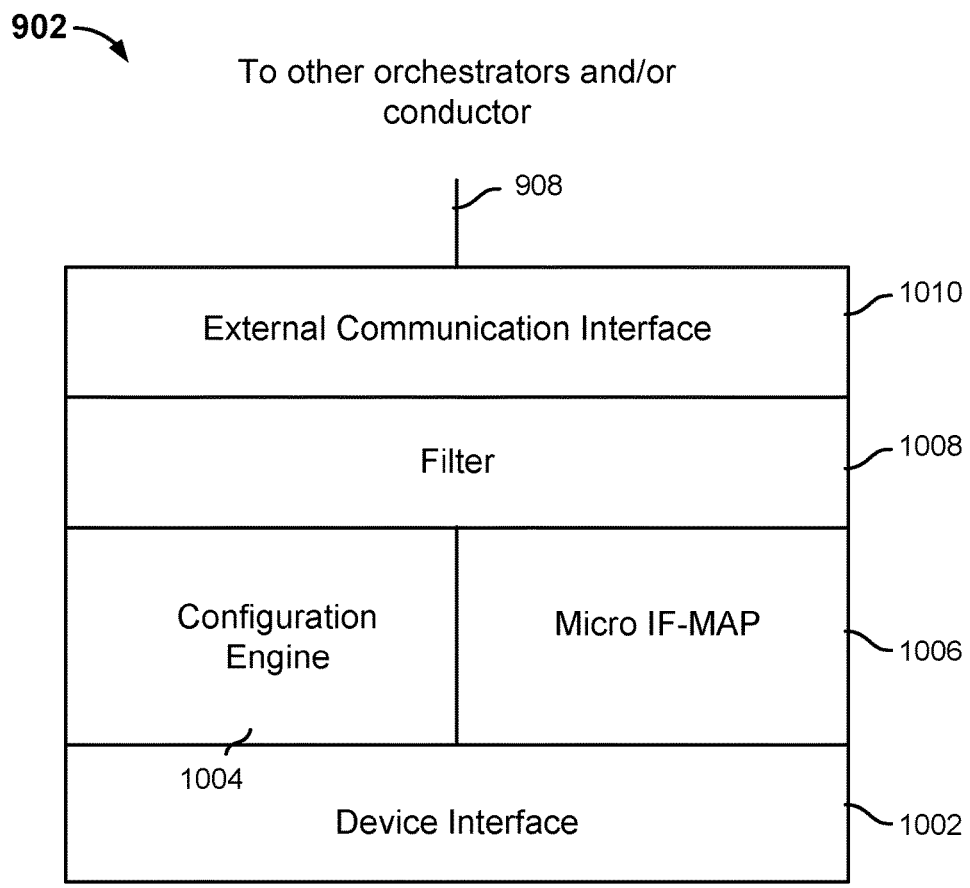
FIG. 10 is a block diagram illustrating an embodiment of an orchestration agent.

The above can be embodied three ways. It can be:
Fully distributed
Fully centralized
Hybrid distributed for local optimization and centralized for global optimization In the fully distributed embodiment, the agent called an Orchestrator is in each node and has a local IF-MAP instantiation. It Connects (etc.) with neighboring (Physical or logical neighbors) using whatever communication resource is available and completes the process. The internal structure of the Orchestrator is shown in FIG. 10.

Figure 7:
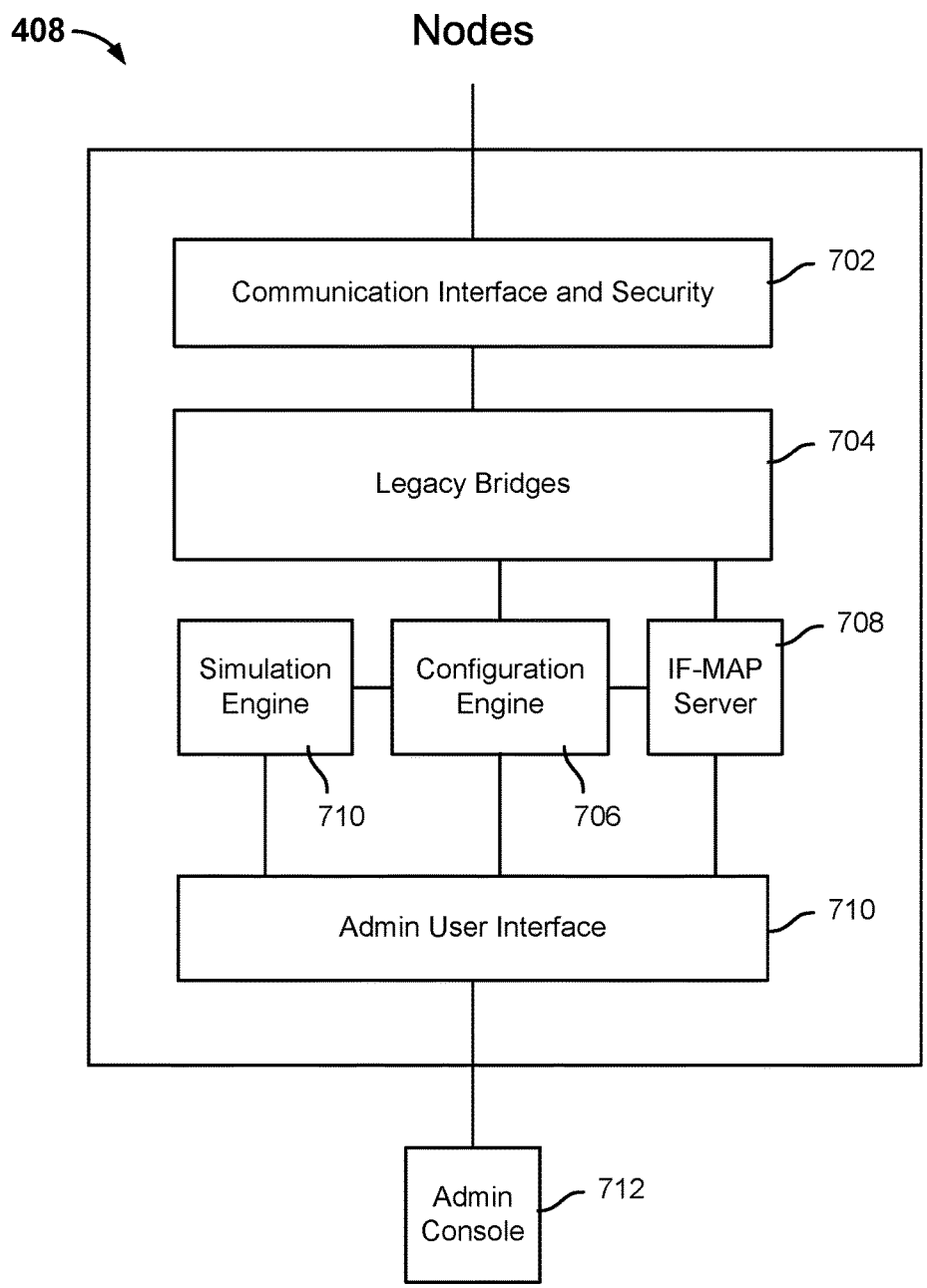
FIG. 7 is a block diagram illustrating an embodiment of a conductor system. In the example shown, conductor 408 includes a communication interface 702 that provides communication with a plurality of nodes, e.g., mobile network elements.

In the fully centralized embodiment all agents for all nodes are located in a central server called a Conductor. Inside the Conductor the agents and their associated IF-MAP images interact using the internal communications mechanisms in the server. The Conductor converts the results of the interaction into instructions it sends to the remote nodes. All remote nodes send status information to the Conductor which is entered into the corresponding node image. The Conductor also contains a Simulator. The simulator allows what if questions to be asked and answered to evaluate different possible courses of action. The internal structure of the Conductor is shown in FIG. 7.

In the hybrid solution local optimization is performed as per the fully distributed embodiment. A portion of the information contained in the local IF-MAP image contained in the Orchestrator is sent to the Conductor. The selection of the information sent to the Conductor is determined by the Filter. The reason for filtering is to reduce the amount of capacity consumed by the overhead of sending updates to the Conductor. The Conductor monitors global environment information not easily made available to the Orchestrators and combines that global information with the node IF-MAP images to develop instructions sent to the Orchestrators. These instructions can take the form of new rules, new objectives, new algorithms, or new environment data. They may also involve creating new types of parameters in selected nodes.

At initial implementation, most of the Network devices will not have been designed with the Conductor in mind. Therefore, the Conductor contains a Legacy Bridges internal component. This component will contain a set of translation facilities to interface with existing network components using their existing protocols and interfaces. Since these existing protocols and interfaces didn't foresee the development of these embodiments, the information available may not include all the parameters that would produce the most optimal orchestration. Thus there may be a migration path where a Network starts with a Conductor and over time obtains new network components that contain Orchestrators.

Figure 1C:
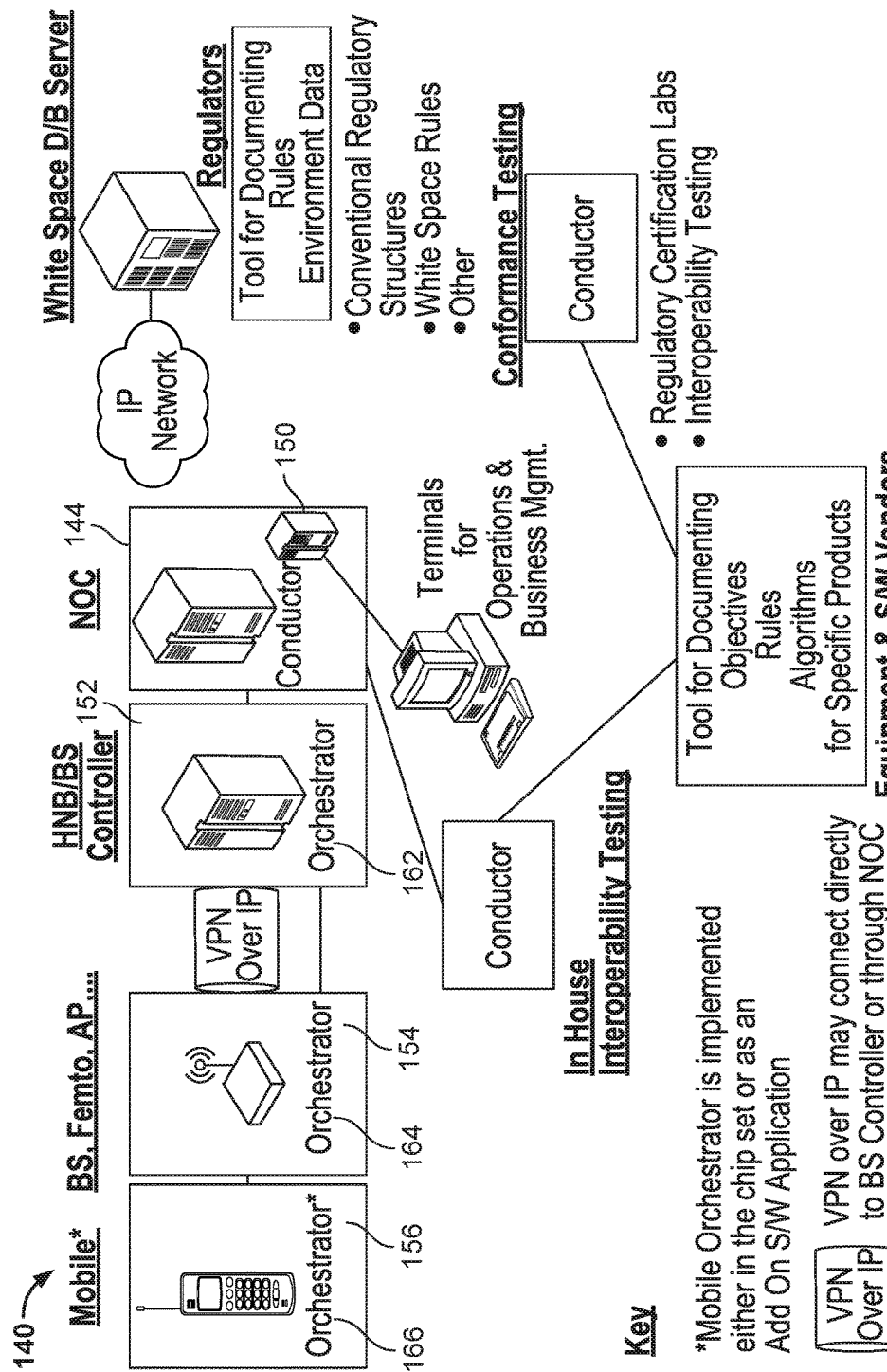
FIG. 1C illustrates how the problem illustrated in FIG. 1A is transformed by these embodiments.

FIG. 1C illustrates how the problem illustrated in FIG. 1A is transformed by these embodiments. In network 140 the separate NOC's 104a, 104b, 104c of FIG. 1A are subsumed into a single NOC 144 that comprises a Conductor 150 configured to coordinate elements as disclosed herein across vendors and across monitoring, control, and database domains. That is, all the separate NOC's continue but NOC 144 provides comprehensive coverage. In some embodiments, as in the example shown in FIG. 1C, network elements such as base station controller 152, base station (or equivalent) 154, and mobile user devices such as device 156 each is equipped with an Orchestrator (162, 164, 166) that acts on behalf of the element to coordinate operations among the elements, as applicable under the control and direction of Conductor 150. All the underlying complexity is still present. All the underlying diversity of network component organizations, vendors, etc. is still present. However, the Network operator is able to optimize the Network 140 as a single organic whole. In the example shown, participants other than the Network operator, such as equipment and software vendors, regulators, in house testing teams, external certification and/or compliance organizations, etc., define in a common metalanguage and/or otherwise in a prescribed and/or interoperable manner, as applicable, rules, objectives, algorithms, and environment data applicable to the configuration and operation of the Network 140. The Conductor 150 and Orchestrators 162, 164, 166 use these, as applicable, to coordinate operations in a manner that meets Network and Network element objectives in an optimal manner consistent with the limitations and capabilities of various Network elements and applicable regulatory or other requirements. Although primarily focused on the Network 140, these embodiments can be extended to other industry roles including but not limited to equipment/semiconductor/software vendors, testing facilities, and regulators.

In various embodiments, wireless network nodes are represented by a stored image that captures information such as the objective(s), capabilities, rules, algorithms, and configuration of the nodes. As resource or other requirements arise, a process of discovery, description, negotiation, configuration, and execution of operations through completion is used to fulfill the requirement. In some embodiments, orchestration agents installed at/on mobile system nodes interact to perform one or more steps of the process illustrated in FIG. 1B and described later in this document, to fulfill requirements through interactions to achieve optimal network orchestration. In some embodiments, orchestration elements (called Orchestrators in some embodiments) are only in the nodes. In other embodiments, orchestration is performed only in the centralized control servers (by entities called Conductors in some embodiments). Finally, in some embodiments, the orchestration elements are present in both the nodes and in centralized control servers; that is there are both Conductor(s) and Orchestrators. Systems that combine both Orchestrators and Conductors have the capability to handle the greatest complexity and largest scale.

Figure 1D:
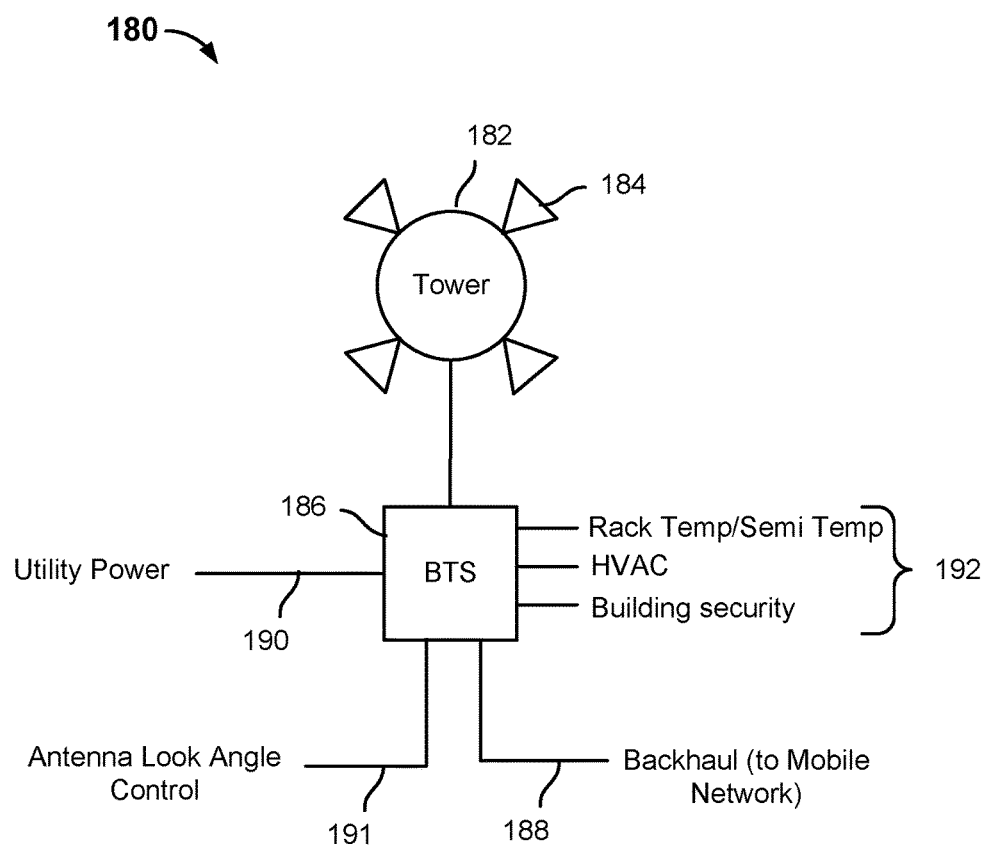
FIG. 1D is a block diagram illustrating an embodiment of a base transceiver system.

FIG. 1D is a block diagram illustrating an embodiment of a base transceiver system. In the example shown, a base station 180 which supports mobile devices comprises a cell tower 182 (for macro basestations a tower, building top, etc.; for pico, nano, femto, etc. basestations a similar but smaller scale device for mounting antenna arrays) on which a physical or logical array of antennae 184 are mounted. Each points in a direction and is oriented at an up or down angle, under control of antenna look angle control signals 191, to provide cell coverage in a coverage area near tower 182. The tower and antennae are associated with a base transceiver station (BTS or other base station) structure 186, in which equipment to convert signals received via antennae 184 to information signals to be sent to the mobile network infrastructure via a backhaul connection 188, and vice versa, and associated auxiliary equipment are housed. Utility power is supplied via a line 190. HVAC status and environmental (e.g., temperature) parameters, readings from specific sensors on racks, components or individual semiconductors security alarms, and data associated with other conditions are monitored via feedback signals 192, which provided monitoring data to a central operations center for monitoring. Each of these feedback signals are generally carried on their own separate channel to there own separate monitoring console.

Figure 2:
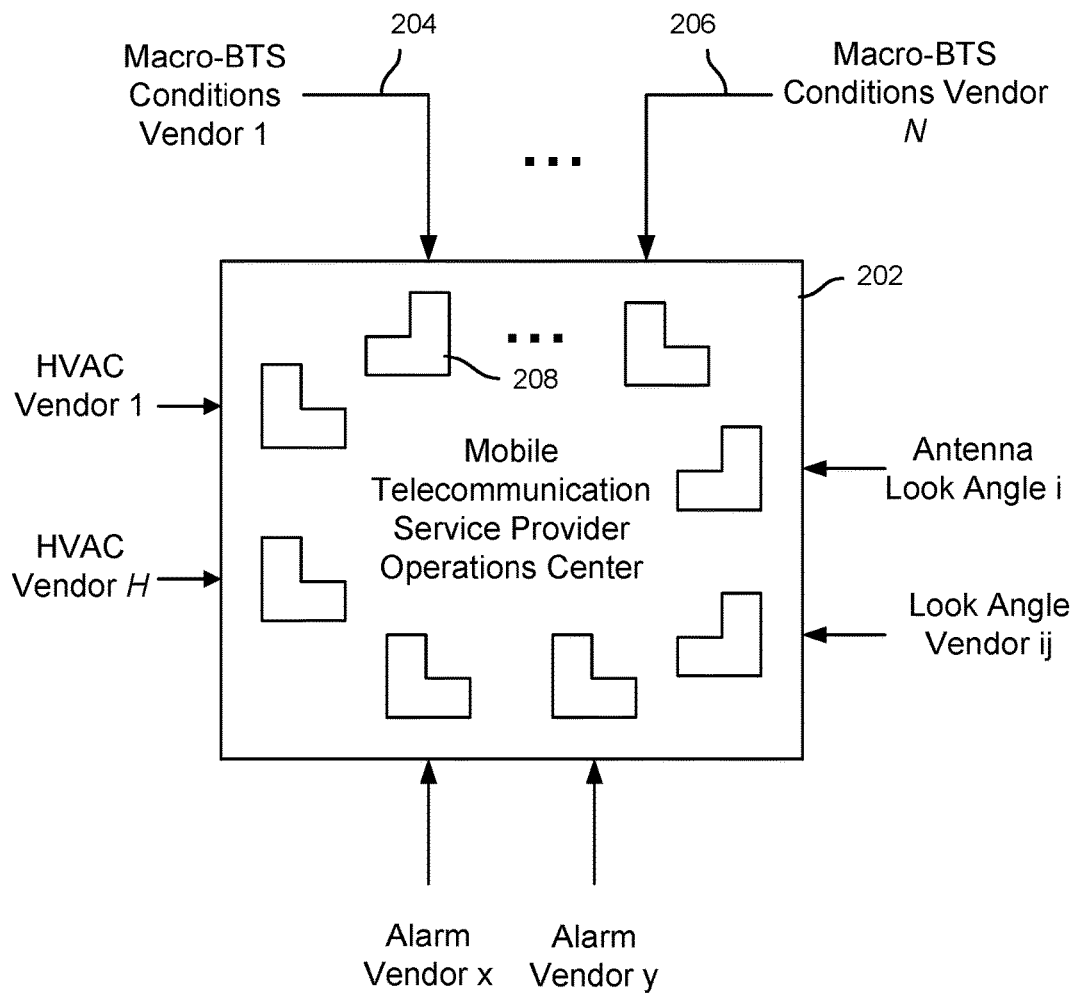
FIG. 2 is a block diagram illustrating a portion of the problem of conventional operation centers for mobile and related telecommunications systems.

FIG. 2 is a block diagram illustrating a portion of the problem of conventional operation centers for mobile and related telecommunications systems. In the example shown, telecommunications service provider operations center 202 receives control, monitoring, and other information from multiple domains. In the example shown, the information includes data representing base station conditions for a plurality of base stations from different vendors, represented in FIG. 2 by base stations 204 and 206. In addition, monitoring and control are provided for at operations center 202 for each of a plurality of HVAC vendors, security alarms vendors, and antenna look angle control and monitoring for multiple vendors. Each monitoring and/or control domain has a corresponding separate administrative console 208, typically implementing separate, independent, and/or proprietary applications, displays, and/or protocols to provide monitoring and control of associated elements. Multiple administration consoles 208 are provided in the example shown to enable an administrator to monitor and control network nodes, and typically multiple consoles are required to be used to monitor and control different aspects of a single node. Examples of such monitoring and control include without limitation responding to an alarm condition by reconfiguring other BTS's; reconfiguring a BTS in one or more radio access network (RAN) aspects; changing a direction and/or tilt angle, or the operating frequency, of a BTS antenna; responding to femtocell/macro basestation call quality being degraded due to excess latency in the DSL or other backhaul path by reconfiguring the Network; etc.

In a typical prior art mobile network, each of the various control and monitoring domains described employs its own sensors, communication paths, software, and in some cases hardware to provide control and monitoring capability at the network operations center. In addition there are different systems for each vendor of each type of equipment. Finally, as shown in FIG. 1A, typically there are multiple network operations centers each for its own administrative unit; each with separate and overlapping ranges of control; and each with its own separate data bases. Multiple human operators scan independent monitoring interfaces and reports to identify problems, and interact with independent control systems to resolve issues or attempt to optimize all or part of the network, for example by calling in external resources and/or redeploying system resources. Within each domain a degree of automated monitoring and corrective action may be provided, but detection of problems that manifest themselves in different ways across multiple domains, and coordination of responses that require action in multiple control domains, typically requires human involvement to correlate information and determine and initiate responsive action. Such human involvement and response may be difficult or impossible in some circumstances because of latency issues and/or complexity issues. Therefore, in some cases, capabilities are disabled to simplify the management/configuration problem and reduce the probability of problems resulting in network outages or other negative consequences. Furthermore, each monitoring system is unique and requires personnel trained in its specific operation. What generally transpires is that there are individuals who are trained for each and don't know how to use any but the single one they have been trained on. This imposes further limitations.

Figure 3A:
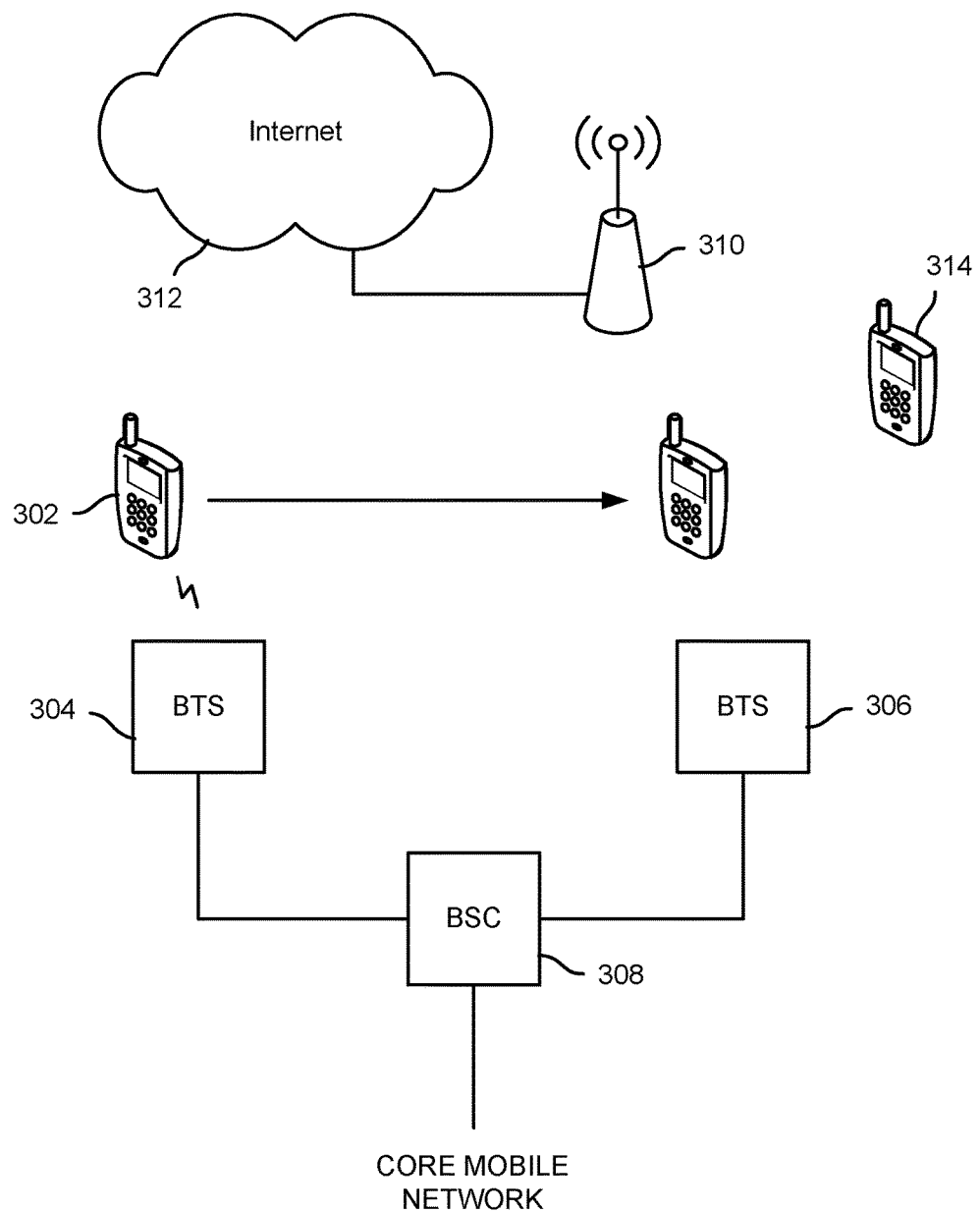
FIG. 3A is a block diagram illustrating an embodiment of a wireless communication system.

FIG. 3A is a block diagram illustrating an embodiment of a wireless communication system. In the example shown, mobile equipment 302, such as a smart phone, is shown moving from a coverage area of a BTS 304 to an area served by a BTS 306. Each of the BTS's 304, 306 is connected to a core mobile network via a base station controller (BSC) 308. In a conventional system, BSC 308 is configured to interact with nodes of the core mobile network and BTS's 304, 306, and mobile equipment 302, to handover the communication channel from BTS 304 to BTS 306. Also shown in FIG. 3A are a wireless access point 310 configured to provide connectivity via WiFi protocols to the Internet 312. Some mobile service providers have configured phones and their core mobile network to use WiFi preferentially for certain services, for example ones that require transmission of large amounts of non-voice data. However, mobile service providers have not yet integrated WiFi or other non-cellular access fully with their conventional mobile infrastructure, such as BTS's 304, 306, to provide the ability to seamlessly establish a call and maintain call continuity, quality, privacy, and security across different types of access network.

In addition, cellular network nodes, such as BTS 304, 306, can be configured, typically manually, to support different access protocols and/or technology. Such configuration to date has required human intervention, which limits the ability of the mobile telecommunications system to redeploy resources dynamically in response to conditions. However, if an effective and automated way to monitor conditions across domains were provided, access could be provided to equipment 314 via access point 310, for example, or a call in which mobile equipment 302 was a participant could be handed off to being serviced via access point 310 and BTS 306 redeployed to support 5G, 6G, 7G, etc. communications. Current technology provides some mechanisms in some cases which can take into account some aspects of conditions in the radio access network, but there are no such mechanisms that can dynamically respond to changes in all of the separate monitoring and/or control systems shown in FIG. 2B. As noted, in current mobile networks human intervention, using monitoring and control data and interfaces across multiple domains, would be required to detect such a situation, determine a cross-domain realignment of resources to address the situation, and implement changes required to implement same.

Modeling mobile telecommunication elements as nodes, each having one or more attributes such as an objective, capabilities, rules, algorithms, configuration, environment, etc., and each capable of having and/or fulfilling a resource requirement, is disclosed. In various embodiments, each node is represented by a meta-language based description of its attributes. A process of discovery, negotiation, agreement, and execution is implemented to fulfill requirements.

Figure 3B:
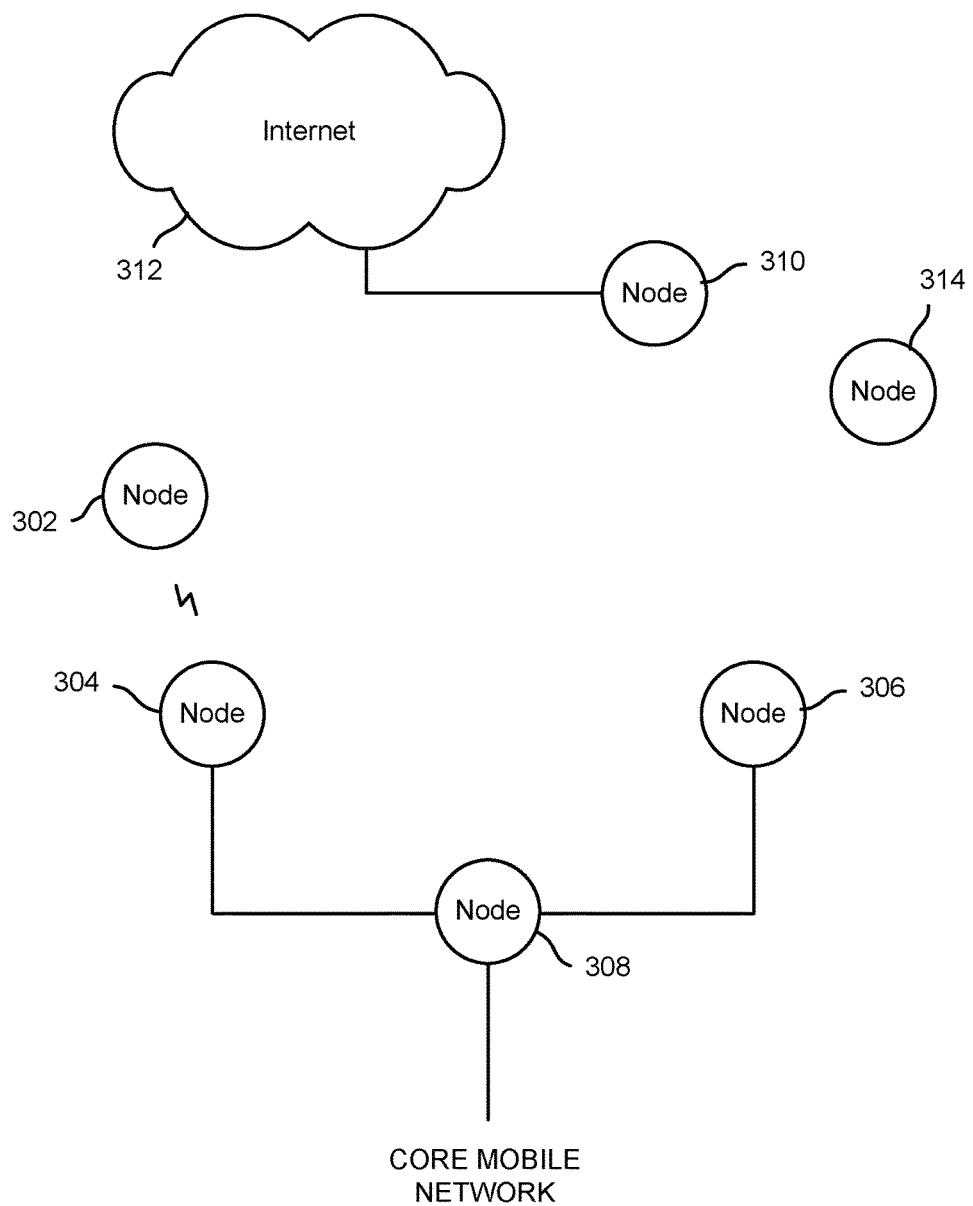
FIG. 3B is a block diagram illustrating an embodiment of a wireless communication system.

FIG. 3B is a block diagram illustrating an embodiment of a wireless communication system. In the example shown, each of the mobile network elements of FIG. 3A is shown as a node capable of having and/or fulfilling one or more objectives of/for one or more other nodes. In the system as shown in FIG. 3B, mobile equipment 302 is represented as a node having an objective (establish and maintain a call), capabilities (radio elements, memory, processor, AIS's and configurations of AIS's supported, current state of battery charge, software modules available, etc.), configuration (e.g., current specific configuration of a specific Air Interface Standard(s) operating, software modules enabled, types of data in output cues, etc.), rules (such as network operator and/or regulator promulgated constraints that are only active in service provider country or other area, equipment, semiconductor or software vendor constraints on clock speed, component temperature, or other technical parameter, constraints from user contract for service, constraints established by end user concerning cost, privacy, security and other end user concerns, etc.), algorithms, and environmental information. The objective(s) of node 302 is capable of being met equally by any other node in its environment, in this example node 304 (one type of basestation), node 306 (another type of basestation) or node 310 (a wireless access point). As described more fully below, in various embodiments a process of discovery, description, negotiation, configuration, initiation, maintenance and discontinuation is employed to determine which node, in this example node 306 or node 310, or node 314 optimally (considering status of and effects on backhaul network to node 308 and/or 312, HVAC, component temperatures, power quality and availability, radio access network conditions, etc.), fulfill the need of node 302 to meet its objective (establish and maintain connectivity seamlessly for a communications session). The process in various embodiments takes into consideration simultaneously the objectives of all nodes, and determines an optimal solution both locally and globally for the Network.

Figure 4:
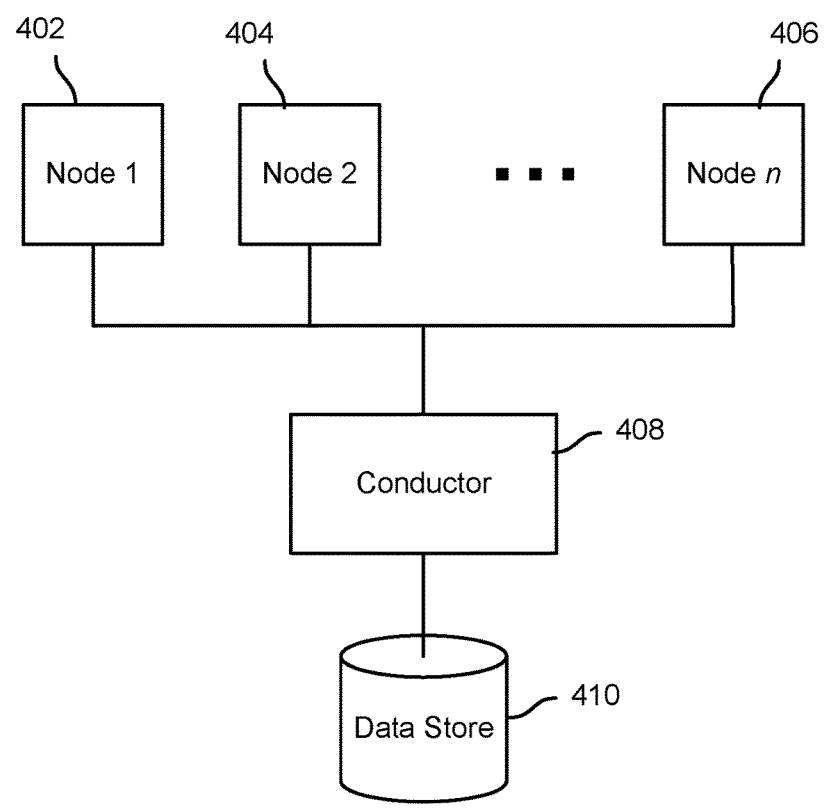
FIG. 4 is a block diagram illustrating an embodiment of a wireless communication system.

FIG. 4 is a block diagram illustrating an embodiment of a wireless communication system. In the example shown, mobile network elements are modeled as a plurality of nodes, represented in FIG. 4 by nodes 402, 404, and 406. The nodes are coordinated, in the example shown, at least in part by a conductor system 408. The conductor 408 accesses node image data and global information about the environment which can include technical detail not available to the node, environmental information (such as sun spot forecasts, impending hurricane, etc.) and impending human activity which will affect demand for services (such as a parade, sporting event, political demonstrations, etc.) stored in a data store 410 to determine for a resource or other requirement a node to fulfill the requirement. In various embodiments, each of the nodes 1 through n is represented in data store 410 by node image data that indicates one or more of an objective of the node (e.g., establish and maintain call connectivity as required), rules that apply to the node, algorithms associated with the node (e.g., ones the node is configured to implement and/or algorithms the conductor 408 should use to meet needs of the node and/or determine whether the node should be used to meet a particular need), capabilities of the node, how the node is configured and/or capable of being configured, and an environment in which the node is operating, e.g., currently. In various embodiments, the data store 410 is implemented as an IF-MAP or similar data store, in which each node is represented by a metadata record that expresses attributes of the node in a meta-language. The IF-MAP data store enables a data schema to be derived from metadata records received to be stored. IF-MAP provides the ability of IF-MAP clients, such as nodes 1 to n, to store and update metadata records, and for nodes and/or conductor 408 to subscribe to be updated in the event of changes in node image data, for example as a node is reconfigured, has a capability degraded and/or upgraded, detects a change in its environment, such as a beacon or other signal of a nearby BTS or femtocell, etc. While IF-MAP is used in some embodiments, in other embodiments any data store that does not require an upfront, agreed defined data model, but rather can grow organically, may be used.

In various embodiments, conductor 408 is configured to fulfill requirements by searching node image data in data store 410 to identify one or more nodes capable of fulfilling the requirement. Competing requirements are fulfilled optimally by applying one or more algorithms identified in node image data as being associated with and/or supported by one or more nodes identified based on node image data as having a capability that could be used to fulfill the requirement. The conductor 408 in various embodiments is configured to resolve differences between algorithms associated with dissimilar nodes and/or to implement a global optimization algorithm configured to achieve a globally optimal solution, 4 g by finding an optimal combination of locally optimized solutions.

Figure 5A:
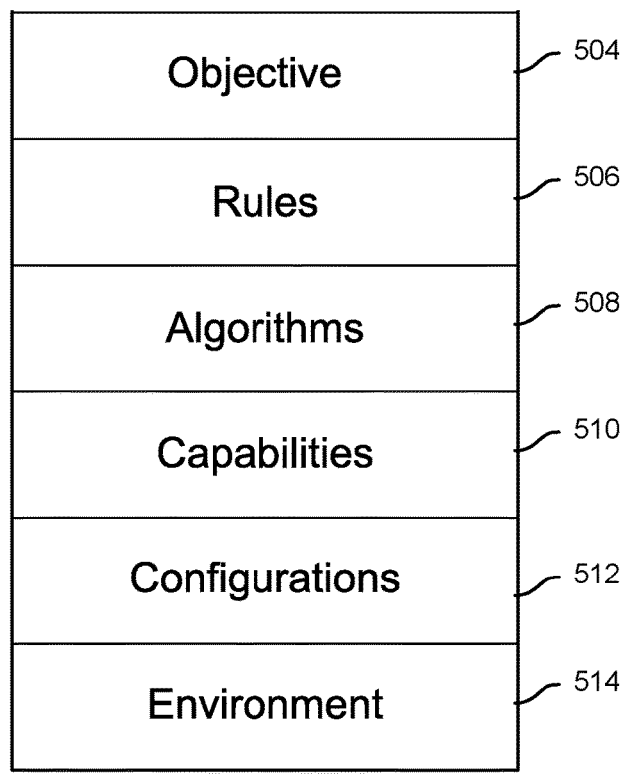
FIG. 5A is a block diagram illustrating an embodiment of a data structure for a node image.

FIG. 5A is a block diagram illustrating an embodiment of a data structure for a node image. In the example shown, node image 500 includes metadata, expressed in a meta-language, that stores various attributes of the node, including in the example shown one or more objectives 504 of the node, one or more rules 506 applicable to the node, one or more algorithms 508 associated with the node, one or more capabilities 510 of the node, one or more current and/or possible configurations 512 of the node, and an environment 514 in which the node is operating. In various embodiments, the respective nodes and/or the conductor create the node image 500, for example by storing metadata in a node image record in an IF-MAP or other data store, as described above.

Figure 5B:
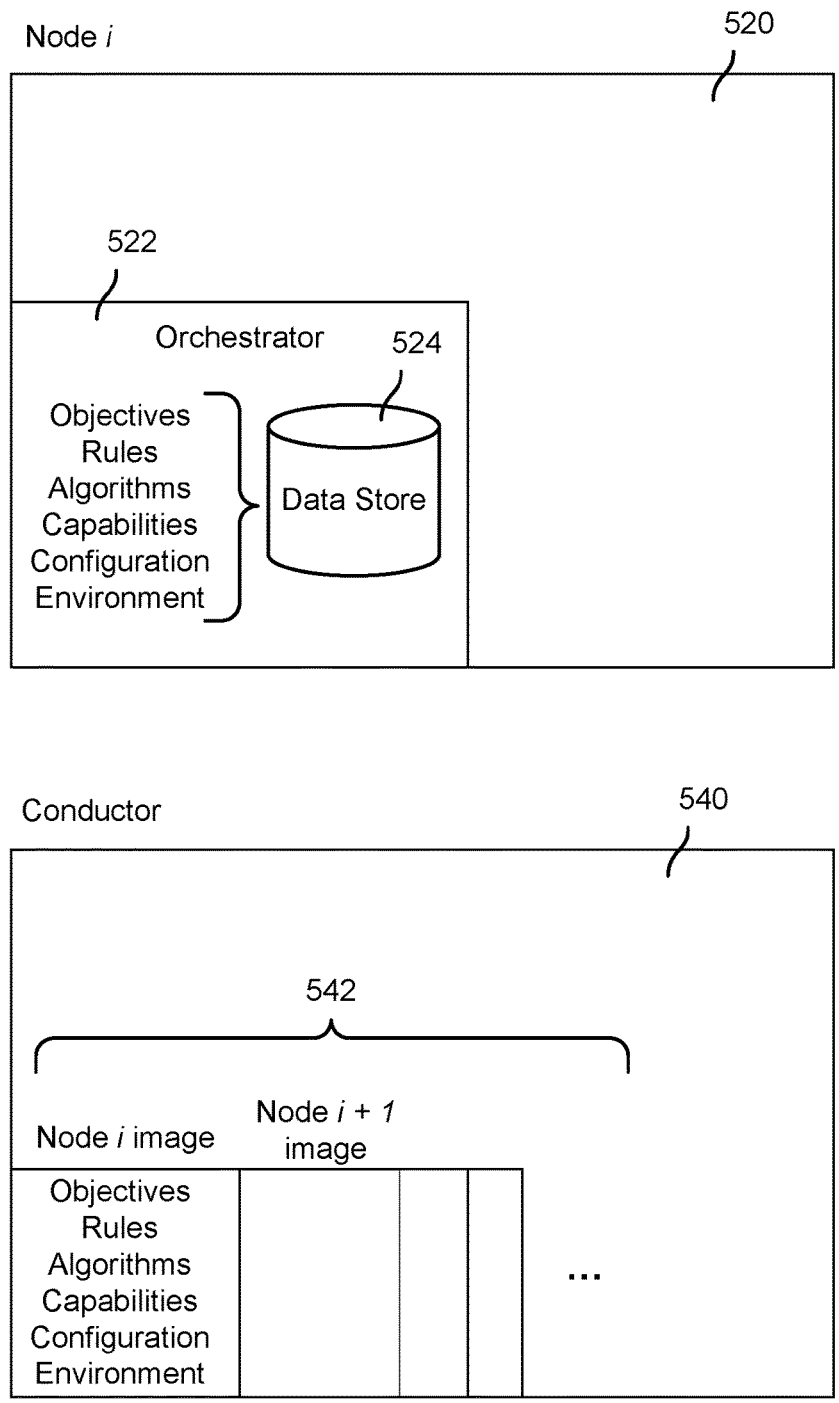
FIG. 5B is a block diagram illustrating an embodiment of a node and a conductor configured to store a node image.

FIG. 5B is a block diagram illustrating an embodiment of a node and a conductor configured to store a node image. In the example shown, node i 520 includes an Orchestrator 522 that stores in a local data store 524 node image data such as that shown in FIG. 5A. Conductor 540 stores node images 542 for a plurality of nodes, each image in some embodiments corresponding to node image 500 of FIG. 5A.

Figure 6:
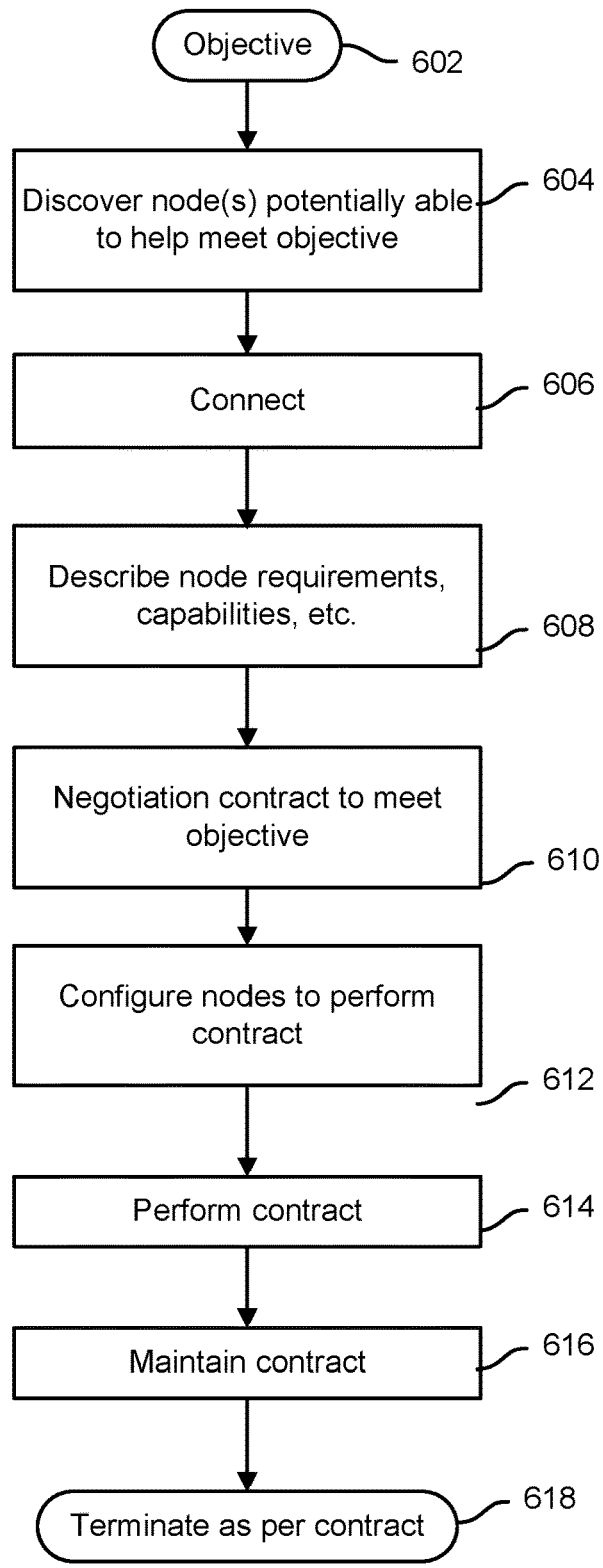
FIG. 6 is a flow diagram illustrating an embodiment of a process to orchestrate mobile network elements.

FIG. 6 is a flow diagram illustrating an embodiment of a process to orchestrate mobile network elements. In the example shown, when an unmet or not fully achieved objective exists (602), processing to discover one or more nodes to help achieve the objective is performed (604). For example, in some embodiments a central coordinator, such as conductor 408 of FIG. 4, searches node images in a data store such as data store 410 to find nodes whose metadata indicates their suitability and/or availability to fulfill the requirement. For example, in the case of a sudden degradation of a backhaul connection of a cell that has been servicing an ongoing call, one or more nodes determined to be in the current environment of the mobile equipment, determined for example based on the mobile equipment node's node image data, may be identified as potentially able and available to begin facilitating the call. In the example shown, a connection is established (606) to one or more discovered nodes, for example to obtain information needed to evaluate the node as a candidate to achieve the objective. In some embodiments, if a central conductor is implementing the process of FIG. 6 a connection may not be made at

606 to the discovered node(s). The requirements, capabilities, etc. of a discovered node are described (608), for example by the node itself or, in an embodiment in which a central conductor implements the process of FIG. 6, by reading relevant node metadata from a node image stored in a data store such as data store 410. A contract to help achieve the objective is negotiated (610), for example via communications between the node having the requirement and a discovered node determined to be capable of helping to achieve the objective, or in an embodiment that includes a central conductor by applying at the conductor an algorithm that results in selection and assignment of a node to help achieve the objective. The node having the objective and the node selected to help achieve the objective are configured to operate together to achieve the objective (612) and the contract is performed (614). The nodes cooperate to maintain the operation (616), e.g., until the contract has been performed as agreed between the nodes and/or as determined by the conductor, after which the operation is discontinued per the contract (618).

FIG. 7 is a block diagram illustrating an embodiment of a conductor system. In the example shown, conductor 408 includes a communication interface 702 that provides communication with a plurality of nodes, e.g., mobile network elements. A set of one or more bridges 704 are configured to translate between node specific communications and a meta-language used by conductor 408 to understand and store the attributes of the respective nodes, receive and process requests from nodes to fulfill requirements, and configure and/or otherwise control and direct nodes to fulfill requirements. Bridges 704 translate communications received from nodes in a node-specific format to a representation in the meta-language, and translate commands, queries, etc. expressed in the meta-language to a node-specific language, as applicable. A configuration engine 706, for example one or more software processes executing on a processor, receives and responds to resource requirements, including by identifying and assigning one or more nodes to fulfill a requirement. An IF-MAP server 708 enables nodes to store and update their image data and/or enables nodes and/or the conductor 408 to subscribe to receive updates to node image data.

A simulation engine 710 is used to simulate one or more potential solutions to fulfill one or more requirements, for example to validate that a proposed assignment of a node to fulfill a requirement would work and would not result in other requirements being generated, etc. In various embodiments, the simulation engine is used to perform simulations to answer what if questions such as what will happen to the Network if this particular new type of wireless end user device is adopted by a given percentage of users, or a new type of software is introduced into the Network, or a particular large scale event were to impact the overall Network environment, etc. The simulator function in the Conductor combines the image data it contains with the new capability, configuration, rules, algorithms and environment data projected for the new device, event condition, etc. and simulates how the Network would appear from a functional and/or other viewpoint.

The conductor using the simulation function can perform verification in various embodiments. To verify that a device or software will function as desired in the Network, the conductor combines metadata provided by the vendor of the device or software with image data on the Network and simulates the result. If the outcome falls within desired parameters, then the device can be declared partially or fully verified. The extent of verification is limited by the completeness and accuracy of the metadata provided by the vendor. Verification functions are performed by network operator internal facilities to test new devices or software before introduced into the Network and by certification labs on behalf of regulators and network operators to certify that devices or software meet standards.

An administrative user interface 710 and administrative console 712 provide the ability to monitor and/or control operation of the conductor 408, for example to execute a system suggested resource allocation and/or configuration, override an automatic resource allocation and/or configuration, and/or otherwise manually provision resources to fulfill requirements and deliver results of simulation and verification testing. In some embodiments, in an initial implementation phase recommendations are delivered to the administrative console and an administrative user can accept or reject the recommendation. Subsequently, in stages greater degrees of automated responsive action are introduced.

Figure 8:
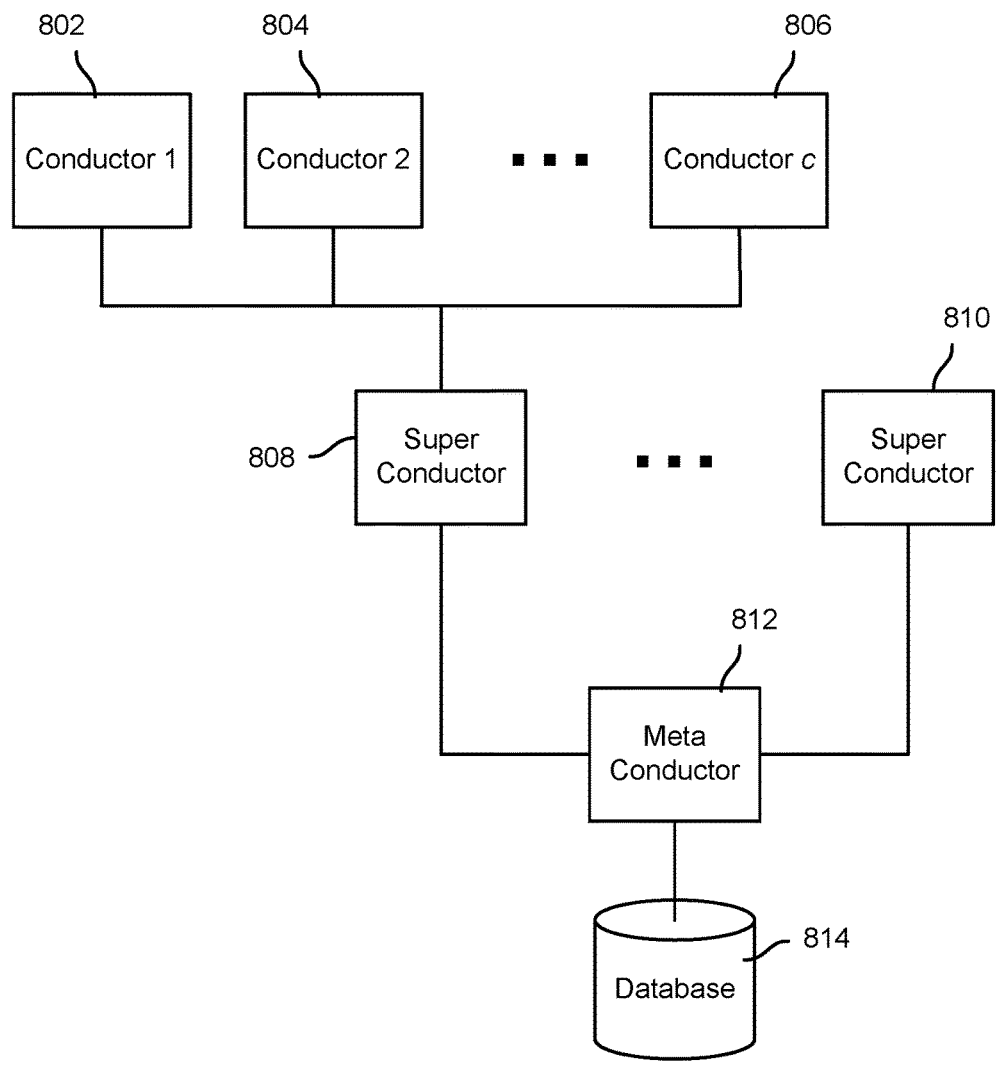
FIG. 8 is a block diagram illustrating an embodiment of a mobile communications system.

FIG. 8 is a block diagram illustrating an embodiment of a mobile communications system. In the example shown, each of a plurality of conductors, represented in FIG. 8 by conductors 802, 804, 806, is configured to orchestrate a corresponding set of nodes, such as mobile network elements, not shown in FIG. 8. A "super" conductor 808 coordinates and optimizes across the conductors 1 to c of FIG. 8, for example by applying one or more over-arching optimization algorithms. In the example shown the super conductor 808 is one of a plurality of super conductors that includes super conductor 808 and super conductor 810. The super conductors are orchestrated by a meta conductor 812, which uses configuration and other conductor and/or node image data stored in a data store 814 to control and optimize across super conductors. While a three level hierarchy is shown in FIG. 8, in other embodiments more or fewer levels of Conductors may be provided to meet optimally the needs of a particular wireless communication system. In a multi-tiered system, tiering can be done to manage the work load or to implement hierarchies of globalness or a combination of the two.

Figure 9:
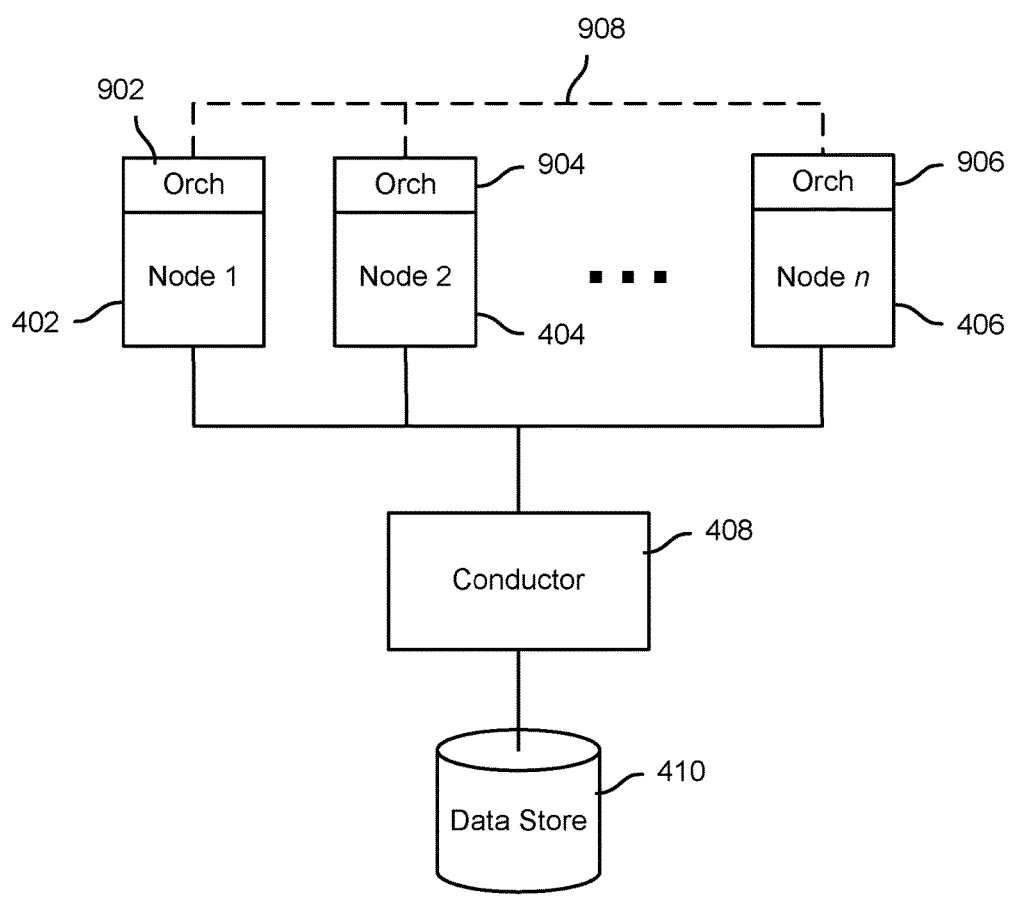
FIG. 9 is a block diagram illustrating an embodiment of a wireless communication system.

FIG. 9 is a block diagram illustrating an embodiment of a wireless communication system. In the example shown, each of the mobile network elements of FIG. 4, represented by nodes 402, 404, and 406, has an associated orchestration agent installed, represented in FIG. 9 by orchestrators 902, 904, and 906. In some embodiments, an orchestration agent comprises software running on a processor comprising the mobile equipment node with which the orchestration agent is associated. The orchestrators 902, 904, and 906 communicate via communication path 908 to express and/or fulfill requirements. In some embodiments, each of the orchestration agents is configured to perform one or more of the steps of the process of FIG. 6, such as by discovering adjacent or otherwise available nodes, establishing a connection or otherwise establishing communication with them, describing and/or discovering capabilities, negotiating a contract to fulfill a requirement, configuring the node with which it is associated to fulfill a contract, and actually performing operations to fulfill the requirement as agreed in the contract. The conductor 408 monitors the behavior of the orchestrators and intervenes when necessary to create global optimization.

FIG. 10 is a block diagram illustrating an embodiment of an orchestration agent. In the example shown, orchestration agent ("orchestrator") 902 includes a device interface 1002 used to interface with the device (node) the orchestration agent is configured to orchestrate. A local configuration engine 1004 interacts with orchestration agents at other nodes and/or a central conductor to obtain help from one or more other nodes to accomplish an objective of the node the orchestration agent is configured to orchestrate. A micro IF-MAP 1006 is used to store locally node image data for the node on which the orchestration agent is stored and in some embodiments, some or all of the image of one or more nodes in the physical or virtual vicinity (physically and/or logically) of the node on which the orchestration agent is installed (part of the node's environment).

A filter layer 1008 determines, in some embodiments, which status information to communicate externally and how frequently, to manage how much capacity is consumed by the overhead of configuration control, etc. An external communication interface 1010 provides connectivity to other nodes via out of band path 908.

In some embodiments, a Control Point token is used to indicate which node has the power to control, whether a resource or other requirement will be fulfilled or attempted to be fulfilled initially by communicating directly with other nodes, for example via their respective orchestration agents, or instead will be sent to a central conductor to obtain fulfillment. In this way, the central conductor, if any, only has to intervene to obtain fulfillment of requirements that a node has been unable to fulfill through local, direct interaction with other nodes. In some embodiments, a filter in each Orchestrator decides what and how much meta-information to share with other nodes and/or with the Conductor. Similarly a filter in the Conductor decides how much information to share with the Meta Conductor and so forth for the Super Conductor. A Control Point decides what should be done and sometimes who is to do it. The Control Point is a "token". It can be passed in whole or in part. So, for example, in a network with no orchestrators and only one Conductor, the Conductor has the complete token. When some nodes are given Orchestrators, those nodes will be given part of the token. Such as the power to determine cell size through transmit power and look angle with adjacent cells if and only if those cells also have Orchestrators, but not with adjacent cells that do not have Orchestrators. In a net where all nodes have orchestrators, the nodes will be given the total local control portion of the Token, but the Conductor will retain the Global portion of the token. In a net of only orchestrators, the nodes will have the complete Control Point Token.

Figure 11:
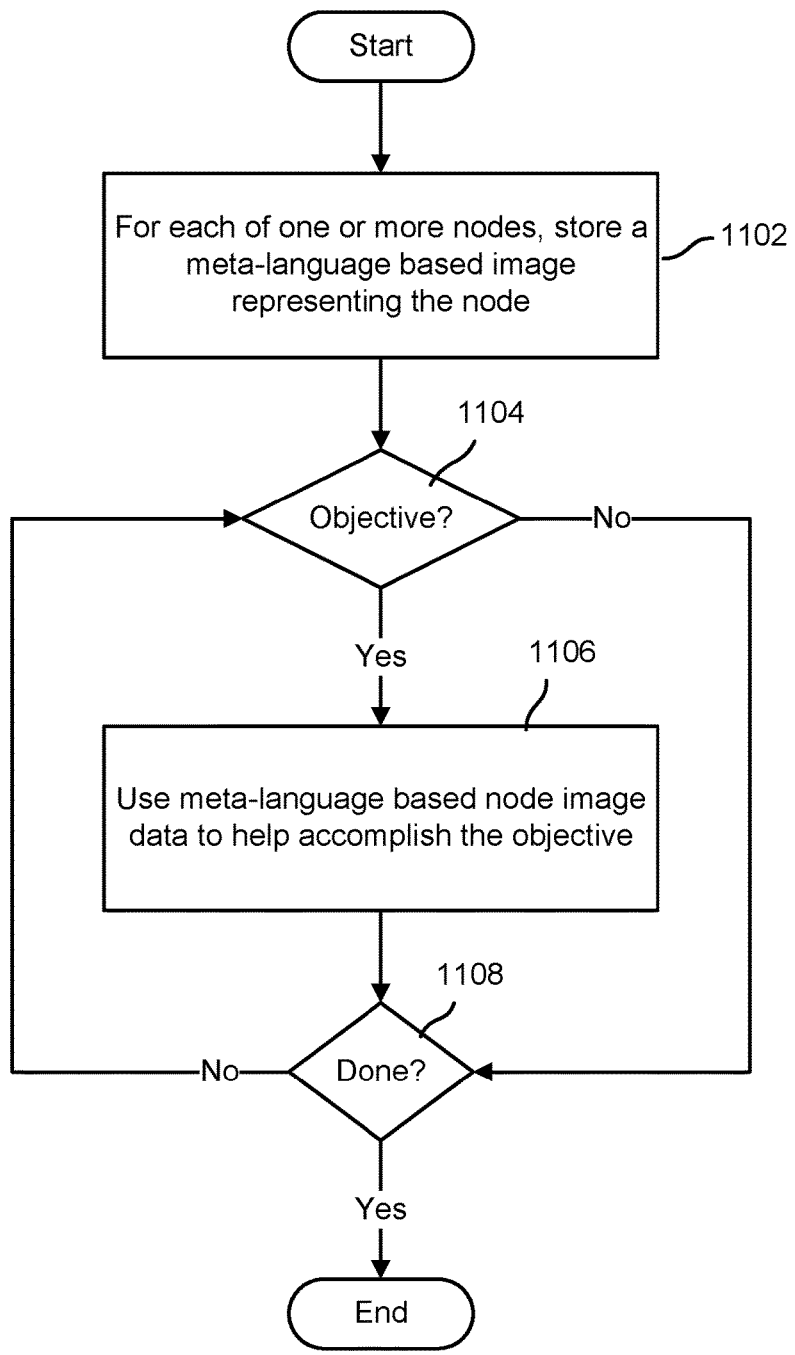
FIG. 11 is a flow diagram illustrating an embodiment of a process to accomplish node objectives through interaction with other nodes.

FIG. 11 is a flow diagram illustrating an embodiment of a process to accomplish node objectives through interaction with other nodes. In some embodiments, the process of FIG. 11 is implemented by an orchestration agent such as agents 902, 904, and 906 of FIG. 9. In the example shown, for each of one or more nodes a meta-language based image data that describes and represents the node and its current state and environment is stored (1102). For example, the node image(s) may be stored locally in a micro IF-MAP or other store with similar properties. When an unmet objective exists (1104), the meta-language based node image data is used to achieve the objective (1106). In some embodiments, node image data stored locally, for example by an orchestration agent running on a node, is used to discover adjacent nodes, obtain a description of each, connect as appropriate, negotiate a contract to help accomplish the objective, for example as described in connection with FIG. 6.

NGMN (Next Generation Mobile Network—an industry association of approximately 150 network operators) has published NGCOR Consolidated Requirements, a 132 page statement of the problem addressed in various embodiments by techniques disclosed herein. See NGCOR CONSOLIDATED REQUIREMENTS BY NGMN ALLIANCE DATE: 18 Jul. 2011 VERSION 0.92 (APPROVED <BY GREMIUM (OC/BOARD)>.

The solution in various embodiments includes use of an organically and dynamically changeable data store. Typical database technology requires a fixed (or slowly changing) data model in order to function, the solution seemed to hinge on the creation of a standard metalanguage that would provide the foundation for this data model. The inventor set out to create such a standard. The inventor had a long and distinguished record of working with standards organizations to create wired protocols and wireless AIS's.

After many years of effort in the standards arena, the inventor came to a solution that used metadata that was described and exchanged in an industry standard protocol and supported by prevailing database technology. However, he came to the conclusion that the vested interests of the industry participants was such that such a standard sufficiently detailed and current to provide the foundation for the data models required for a database solution was impossible. Competitors wanted to differentiate their products, maintain existing barriers to entry of new competitors, and protect margins. The result was that if it was possible to develop the required metalanguage standard at all, it would be out of date and not sufficiently useful to solve the problem when it was finally created. Thus a standard metalanguage supported by a conventional database would not solve the problem.

A breakthrough that resulted in the approach disclosed in various embodiments described herein was the discovery that IF-MAP (and potentially others with the same properties) combined with the Process disclosed herein would solve the problem. IF-MAP allows for organic growth of a data store without an a priori data structure. As new parameters are discovered to be useful, they can be "linked in" without necessitating a restructuring of the database or a global change of all cooperating databases. The Process enables organic response in real time (very little latency) and dramatically reduces the burden on manual intervention resulting in Networks being more robust, secure and performing better. In various embodiments, the 'Process' supported by the use of IF-MAP like technology enables effective monitoring, control, and coordination of wireless network elements, across information and control domains.

Figure 12:
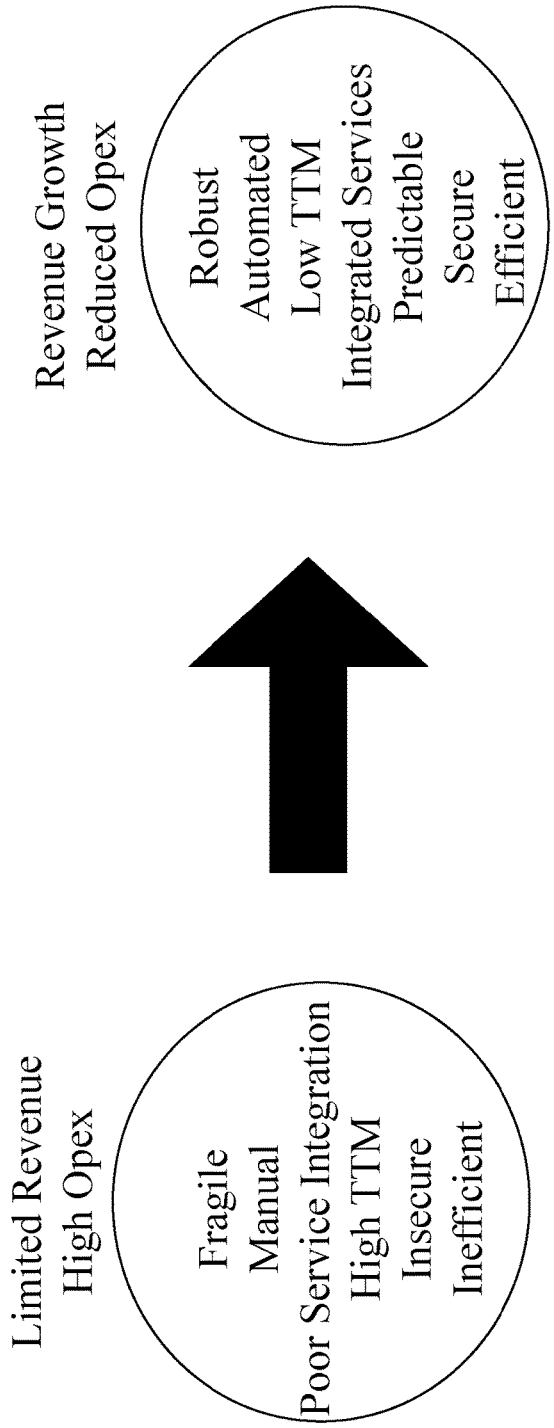
FIG. 12 is a block diagram that illustrates benefits realized by using techniques disclosed herein in various embodiments.

FIG. 12 is a block diagram that illustrates benefits realized by using techniques disclosed herein in various embodiments. The figure shows a transition from a state in which revenue is limited and operating expenses are high to one characterized by revenue growth and reduced operating expenses. Similarly, the figure shows a transition from a fragile state in which a high degree of manual intervention is required, there is poor service integration, a high time to market, insecurity, and inefficiency, to a more robust state in which objectives are achieved through the automated process disclosed herein, resulting in lower time to market, more integrated services, and greater predictability, security, and efficiency.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A communication system, comprising:
 a data store configured to store an image of a first node among images for a plurality of nodes, wherein the first node image is stored using metadata expressed in a meta-language description of the first node, wherein the first node image includes one or more objectives associated with the first node, one or more rules associated with the first node, one or more algorithms associated with the first node, one or more capabilities associated with the first node, one or more configurations associated with the first node, and environment associated with the first node, wherein the first node comprises a transceiver or other communication infrastructure, wherein the one or more algorithms associated with the first node include a set of tools available to the first node to achieve the objectives of the first node given a set of conditions within the constraints of the rules, wherein the environment associated with the first node at least includes environmental information comprising one or more weather events and one or more impending human activities that will affect demand for resources associated with the first node and wherein the data store is configured to derive from the meta-language description of the first node a schema or model to store the meta-language description of the first node, is able to support organic changes to the schema or model, and provides a mechanism to propagate changes dynamically to the schema, model, or data; and a processor configured to:
  receive from a second node orchestrator an indication of an objective associated with a second node, wherein the second node is associated with a mobile user, fixed user, or infrastructure component;
  discover the first node to help achieve the objective associated with a second node at least in part by searching the data store for a node having a capability required to help achieve the objective associated with the second node and an associated environment to achieve the objective associated with the second node;
  identify the first node based at least in part on the meta-language description of the first node comprising the first node image as having the capability required to help achieve the objective associated with the second node and having the associated environment to achieve the objective associated with the second node;
  select the first node to help achieve the objective associated with the second node based at least in part by the applying one or more algorithms associated with the first node image; and
  establish a connection between a first node orchestrator and the second node orchestrator, wherein the first node orchestrator and the second node orchestrator are configured to:
    negotiate a contract with each other to achieve the objective associated with the second node, wherein the second node orchestrator is configured to orchestrate the second node based on the negotiated contract and the first node orchestrator is configured to orchestrate the first node based on the negotiated contract; and
    perform operations to allow the second node to achieve its objective based on the negotiated contract.

2. The communication system of claim 1, wherein the first node orchestrator and the second node orchestrator are further configured to perform one or more of the following: exchange a respective description of a corresponding node, configure the corresponding node based at least in part on the mutually compatible set of configurations, initiate an operation between the first node and the second node to achieve the objective associated with the second node, maintain the operation, and discontinue the operation.

3. The communication system of claim 1, wherein the processor is configured to identify the first node to help achieve the objective associated with the second node at least in part by determining based on node environment data included in one or both of the first node image and a second node image that is associated with the second node that the first node and the second node are each in a physical or logical location relative to the other such that the first node can be configured to help achieve the objective associated with the second node.

4. The communication system of claim 1, wherein the second node orchestrator is configured to negotiate with the first node on behalf of the second node at least in part by sending or receiving, on behalf of the second node, one or more bids comprising sets of parameters to or from the first node.

5. The communication system of claim 1, wherein the first node is identified at least in part by applying one or both of an algorithm of the one or more algorithms associated with the first node included in the first node image and an algorithm included a second node image associated with the second node.

6. The communication system of claim 1, further comprising a bridge configured to translate between the meta-language description comprising the first node image as stored in the data store and a node-specific language used by the first node to communicate within the communication system.

7. The communication system of claim 1, wherein the data store comprises an Interface for Metadata Access Points ("IF-MAP") server or IF-MAP like server.

8. The communication system of claim 7, wherein the first node image includes the meta-language description as published to the IF-MAP server or IF-MAP like server by the first node.

9. The communication system of claim 7, wherein the first node orchestrator, the second node orchestrator, and a central conductor subscribe via the IF-MAP server or IF-MAP like server to receive notification of changes to a node image.

10. The communication system of claim 1, wherein the processor is further configured to identify a third node to which to handover from or to cooperate with the first node an operation to achieve the objective associated with the second node.

11. The communication system of claim 1, further comprising a simulation engine configured to simulate a result of using the first node to help achieve the objective associated with the second node.

12. The communication system of claim 1, wherein the processor is included in a central conductor system configured to coordinate the first node orchestrator and the second node orchestrator in achieving the objective associated with the second node.

13. The communication system of claim 1, wherein the first and second node orchestrators include a corresponding filter configured to limit which and how often information is communicated.

14. The communication system of claim 1, wherein the first node orchestrator is associated with a first set of one or more consoles configured to monitor and control the first node and the second node orchestrator is associated with a second set of one or more consoles configured to monitor and control the second node.

15. The communication system of claim 1, wherein the first node orchestrator and second node orchestrator respectively configure, based at least in part on a mutually compatible set of configurations, the first node and the second node to help achieve the objective associated with the second node.

16. The communication system of claim 15, wherein the mutually compatible set of configurations is negotiated in order to optimize a combined ability of the first node and the second node to work together to achieve the objective associated with a second node.

17. The communication system of claim 16, further comprising a third node that comprises a third node orchestrator, and wherein the respective node orchestrators are configured to communicate with one another to determine an optimal set of nodes to help achieve the objective associated with the second node and to negotiate with one another to determine the mutually compatible set of configurations to achieve the objective associated with the second node.

18. The communication system of claim 17, further comprising a conductor agent configured to monitor the respective node orchestrators and intervene when necessary to create a global optimization.

19. The communication system of claim 1, wherein the first node image includes data identifying the one or more objectives associated with the first node.

20. The communication system of claim 1, wherein the first node image includes the one or more rules that apply to the first node.

21. The communication system of claim 1, where the communication system includes at least one of a wireless communication system, a wired communication system, or an optical communication system.

22. The communication system of claim 1, wherein the other communication infrastructure includes an infrastructure device or a second infrastructure component.

23. A method of orchestrating network elements, comprising:
receiving from a second node orchestrator an indication of an objective associated with a second node, wherein the second node is associated with a mobile user, fixed user, or infrastructure component;
discovering a first node to help achieve the objective associated with a second node at least in part by:
searching a data store for a node having a capability required to help achieve the objective associated with the second node and an associated environment to achieve the objective associated with the second node, the data store stores an image of a first node among images for a plurality of nodes, wherein the first node image is stored using metadata expressed in meta-language description of the first node, wherein the first node image includes one or more objectives associated with the first node, one or more rules associated with the first node, one or more algorithms associated with the first node, one or more capabilities associated with the first node, one or more configurations associated with the first node, and environment associated with the first node, wherein the one or more algorithms associated with the first node include a set of tools available to the first node to achieve the objectives of the first node given a set of conditions within the constraints of the rules, wherein the environment associated with the first node at least includes environmental information comprising one or more weather events and one or more impending human activities that will affect demand for resources associated with the first node, wherein the data store is configured to derive from the meta-language description of the first node a schema or model to store the meta-language description of the first node, is able to support organic changes to the schema or model, and provides a mechanism to propagate changes dynamically to the schema, model, or data;
identifying the first node based at least in part on a meta-language description of the first node comprising a first node image as having the capability required to help achieve the objective associated with the second node, wherein the first node comprises a transceiver or other communication infrastructure;
selecting the first node to help achieve the objective associated with the second node based at least in part by applying the one or more algorithms associated with the first node image; and
establishing a connection between a first node orchestrator and the second node orchestrator, wherein the first node orchestrator and the second node orchestrator are configured to:
negotiate a contract with each other to achieve the objective associated with the second node, wherein the second node orchestrator is configured to orchestrate the second node based on the negotiated contract and the first node orchestrator is configured to orchestrate the first node based on the negotiated contract; and
perform operations to allow the second node to achieve its objective based on the negotiated contract.

24. The method of claim 23, wherein the first node orchestrator and the second node orchestrator are further configured to perform one or more of: exchanging a respective description of a corresponding node, configuring the corresponding node based at least in part on the mutually compatible set of configurations, initiating an operation between the first node and the second node to achieve the objective associated with the second node, maintaining the operation, and discontinuing the operation.

25. The method of claim 23, wherein the data store comprises an Interface for Metadata Access Points ("IF-MAP") server or IF-MAP like server.

26. The method of claim 25, wherein the first node image includes metadata published to the IF-MAP server or the IF-MAP like server by the first node.

27. The method of claim 25, wherein the first node orchestrator, the second node orchestrator, and a central conductor can subscribe via the IF-MAP server or the IF-MAP like server to receive notification of changes to a node image.

28. The method of claim 23, wherein first node orchestrator and the second node orchestrator are configured to negotiate a mutually compatible set of configurations in order to optimize a combined ability of the first node and the second node to work together to achieve the objective associated with the second node.

29. The method of claim 28, wherein a conductor agent monitors the first node orchestrator and the second node orchestrator, and intervenes when necessary to create a global optimization.

30. A computer program product to orchestrate network elements, the computer program product being embodied in a tangible, non-transitory computer readable storage medium and comprising computer instructions for:

receiving from a second node orchestrator an indication of an objective associated with a second node, wherein the second node is associated with a mobile user, fixed user, or infrastructure component;

discovering a first node to help achieve the objective associated with a second node at least in part by searching a data store for a node having a capability required to help achieve the objective associated with the second node and an associated environment to achieve the objective associated with the second node, the data store stores an image of the first node among images for a plurality of nodes, wherein the first node image is stored using metadata expressed in meta-language description of the first node, wherein the first node image includes one or more objectives associated with the first node, one or more rules associated with the first node, one or more algorithms associated with the first node, one or more capabilities associated with the first node, one or more configurations associated with the first node, and environment associated with the first node, wherein the one or more algorithms include a set of tools available to the first node to achieve the objectives of the first node given a set of conditions within the constraints of the rules, wherein the environment associated with the first node at least includes environmental information comprising one or more weather events and one or more impending human activities that will affect demand for resources associated with the first node, wherein the data store is configured to derive from the meta-language description of the first node a schema or model to store the meta-language description of the first node, is able to support organic changes to the schema or model, and provides a mechanism to propagate changes dynamically to the schema, model, or data;

identifying the first node based at least in part on a meta-language description of the first node comprising a first node image as having the capability required to help achieve the objective associated with the second node and having the associated environment to achieve the objective associated with the second node, wherein the first node comprises a transceiver or other communication infrastructure;

selecting the first node to help achieve the objective associated with the second node based at least in part by applying the one or more algorithms associated with the first node image; and establishing a connection between a first node orchestrator and the second node orchestrator, wherein the first node orchestrator and the second node orchestrator are configured to:

negotiate a contract with each other to achieve the objective associated with the second node, wherein the second node orchestrator is configured to orchestrate the second node based on the negotiated contract and the first node orchestrator is configured to orchestrate the first node based on the negotiated contract; and perform operations to allow the second node to achieve its objective based on the negotiated contract.

* * * * *